United States Patent [19]

Hintze et al.

[11] 4,241,277
[45] Dec. 23, 1980

[54] LED DISPLAY PANEL HAVING BUS CONDUCTORS ON FLEXIBLE SUPPORT

[75] Inventors: William Hintze, Camp Hill; Albert Shirk, Palmyra, both of Pa.

[73] Assignee: AMP Incorporated, Harrisburg, Pa.

[21] Appl. No.: 16,576

[22] Filed: Mar. 1, 1979

[51] Int. Cl.³ .................... H01L 23/30; H01L 23/48; H01L 33/00
[52] U.S. Cl. ................................. 313/500; 313/511; 313/512
[58] Field of Search .............. 313/500, 499, 511, 505, 313/512; 357/17 (U.S. only)

[56] References Cited

U.S. PATENT DOCUMENTS

| | | | |
|---|---|---|---|
| 3,290,539 | 12/1966 | Lamorte | 313/114 |
| 3,290,558 | 12/1966 | Sapy | 29/577 X |
| 3,366,914 | 1/1968 | McManus et al. | 361/401 X |
| 3,440,716 | 4/1969 | Dreyer | 29/577 X |
| 3,558,974 | 1/1971 | Stewart | 315/169 |
| 3,780,357 | 12/1973 | Haitz | 313/499X |
| 3,886,581 | 5/1973 | Katsumura et al. | 357/45 X |
| 3,976,906 | 8/1976 | Shattuck | 313/500 |
| 4,000,437 | 12/1976 | Lederhandler et al. | 313/500 |
| 4,011,575 | 3/1977 | Groves | 313/500 X |
| 4,024,627 | 5/1977 | Stauffer | 357/17 X |

Primary Examiner—Palmer C. Demeo
Attorney, Agent, or Firm—Frederick W. Raring

[57] ABSTRACT

Flat panel display device comprises a multiplicity of LED's arranged in parallel rows and parallel columns in accordance with a grid pattern. First bus conductors extend parallel to the rows and each of the LED's is electrically connected to one of the first bus conductors. Second bus conductors extend parallel to the columns and each LED is connected to one of the second bus conductors. The first and second bus conductors are on the oppositely facing surfaces of an insulating film and the LED's extend through openings in the film located on the grid pattern. Contact with the LED's is achieved by tap conductors which extend from the bus conductors to the LED's. A rigid grating is mounted against the film and has open cells which are located in accordance with the grid pattern. Each LED extends into one of the cells and the internal surfaces of the cells serve to reflect the light of the LED's towards the viewer. The grating also serves to support the film during assembly of the LED's to the film and to support the film after the LED's are assembled.

11 Claims, 12 Drawing Figures

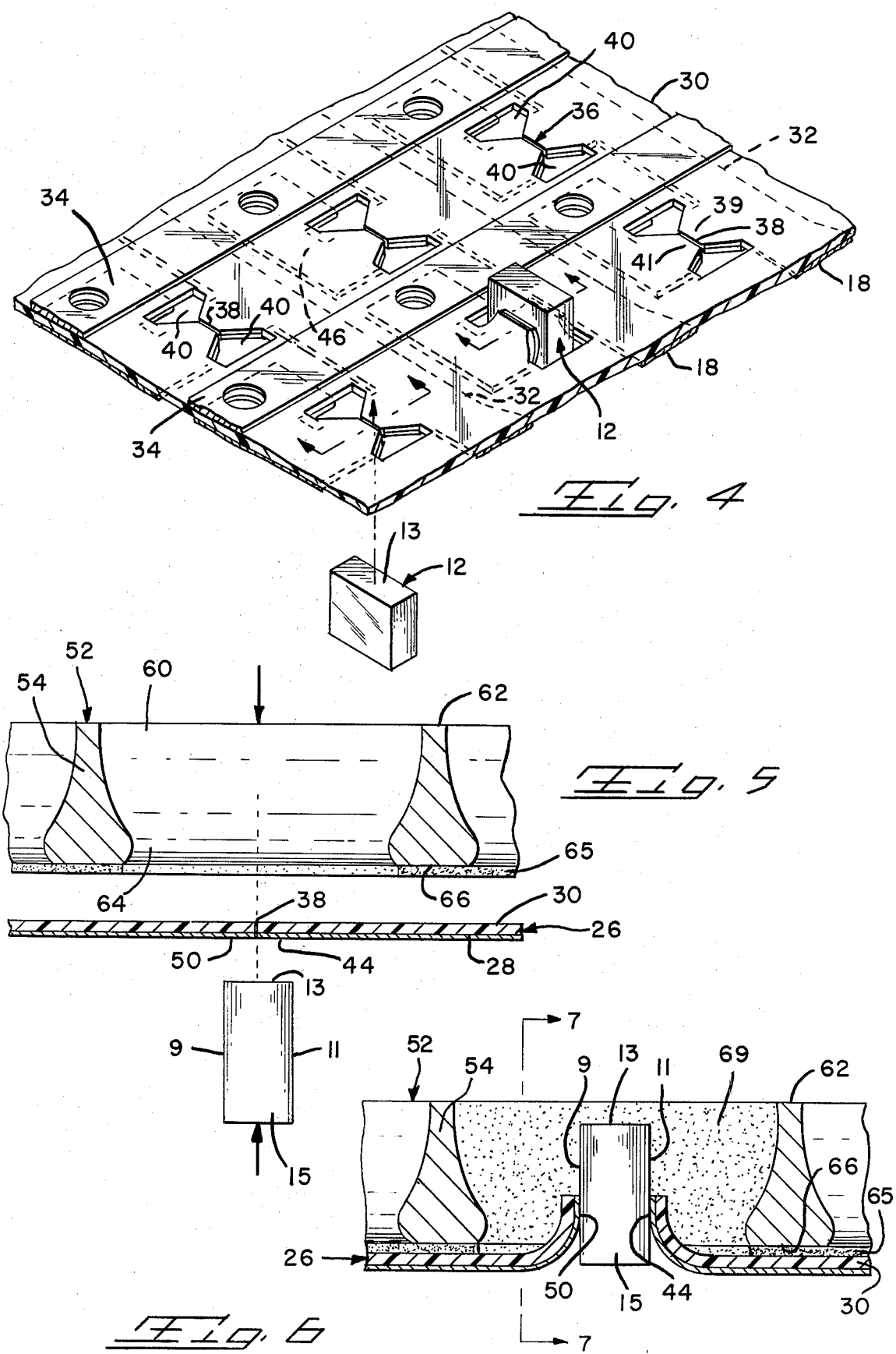

LED DISPLAY PANEL HAVING BUS CONDUCTORS ON FLEXIBLE SUPPORT

FIELD OF THE INVENTION

This invention relates to display device of the type comprising a multiplicity of LED's (light emitting diodes) mounted in side-by-side co-planner relationship and including first and second bus conductors which are in electrical contact with the LED's. The LED's are energized by driver circuits to cause selective LED's to emit light and display information on the panel.

BACKGROUND OF THE INVENTION

One common method used in the electronics industry to manufacture LED display devices is to provide first and second bus conductors on a ceramic substrate with the first bus conductors extending normally of the second bus conductors. The LED's are mounted on the ceramic substrate with each LED located between, or adjacent to, two parallel first bus conductors and adjacent to, or between, two parallel second bus conductors. The bus conductors are connected to the LED's by extremely fine wires which are bonded to the bus conductors and to the LED's. The bus conductors are connected to suitable driver circuits which supply the signals for energizing the LED's.

The presently known manufacturing methods, such as the one described above for producing panel displays, result in relatively high production costs since the conductors must be provided on a ceramic substrate, the LED's must be bonded or otherwise secured to the substrate in some way, and numerous wire bonding operations must be carried out to connect each LED to one of the first bus conductors and to one of the second bus conductors. The present invention is, in accordance with one aspect thereof, directed to the achievement of an LED panel which can be produced at lower cost than is possible by presently known manufacturing methods.

In accordance with a further aspect of the invention, a light collimating means is provided for each LED in a panel. An individual LED produces only a minor amount of illumination and the light emitted is radiated in all directions from an energized LED. The viewer positioned in front of a LED panel, therefore, sees only a portion of the relatively minor amount of illumination produced by an individual LED. Furthermore, when information is displayed, an individual LED may be energized for only an extremely short time interval, a fact which further limits the usefulness of LED display panels. A light collimating means in accordance with the present invention has the effect of focusing the light emanating from individual LED's directly towards the viewer, and enhancing the clarity of the display.

In accordance with the present invention, a flat panel display device is manufactured by providing a thin flexible insulating film with the first and second bus conductors on the oppositely facing surfaces thereof. The first bus conductors extend parallel to each other and are arranged in rows while the second bus conductors are arranged in parallel columns which extend normally of the rows. LED receiving openings are provided between adjacent rows and between adjacent columns. First and second tap conductors extend from the first and second bus conductors to each of the openings, the tap conductors being located on the first surface of the film.

Prior to assembly of the LED's to the film, a grating having cells therein arranged in accordance with the grid pattern of the display is placed against the second surface and secured to the second surface. The individual LED's are then inserted into the openings from the first surface of the film so that portions of each LED are surrounded by the sidewalls of a cell. When the LED's are inserted, portions of the film are flexed in the direction of insertion and the tap conductors are thereby brought into contact with the LED's. The grating serves physically to support the film and the sidewalls of the cells function as reflecting surfaces for the LED's when they are energized.

DESCRIPTION OF THE DRAWING

FIG. 4 is a fragmentary perspective view of a portion of the flexible circuit illustrating the manner in which the LED's are assembled to the LED sites; the grating is omitted from this view in the interest of clarity.

FIG. 5 is a view taken along the lines 5—5 of FIG. 4 but showing the grating spaced from the film.

FIG. 6 is a view taken along the lines 6—6 of FIG. 4 and showing the grating positioned against the surface of the film; this view also shows potting material in the cells of the grating and incapsulating the LED.

Figures 9, 10:
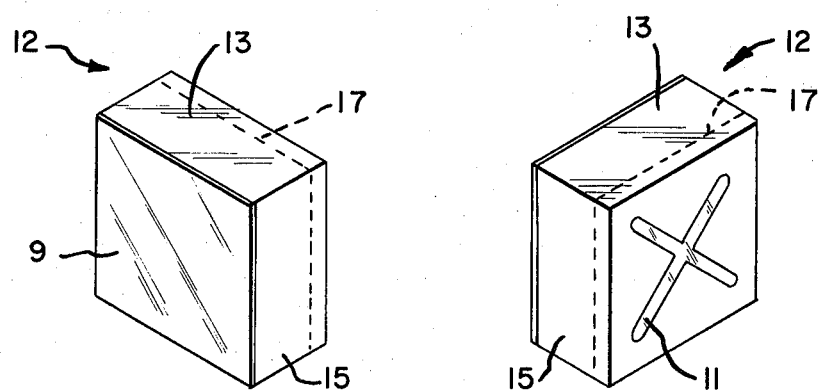
FIGS. 9 and 10 are perspective views of an LED.

Referring first to FIGS. 9 and 10, a light emitting diode 12 comprises a rectangular block having oppositely facing anode and cathode surfaces 9, 11 respectively and laterally facing surfaces 13, 15. The cathode surface 9, is entirely metalized as indicated, while the anode surface 11 has a portion of its surface metalized so that it can be distinguished from the cathode surface.

The standard thickness of a LED is 0.006 inches and the length along the edges of the surfaces 13, 15, is 0.012 inches.

When a voltage is applied across the surfaces 9,11, light is produced in a plane indicated at 17 which is adjacent to, and which extends parallel to, the anode surface 11. The light is transmitted in all directions from this plane 17 and radiates from the LED through the surfaces 13, 15 and from those portions of the surface 11 which are not metallized. For maximum brightness, it is desirable to mount LED's in an orientation such that the surfaces 13 or 15 are in front of the viewer rather than the surface 11. As will be explained below, a LED display assembly in accordance with the present invention supports the LED's such that the side surfaces 13, 15 are directed towards the viewer and are in the direct line of sight of the viewer.

Referring now to FIGS. 1-4, an LED display assembly 2 in accordance with the invention may be generally rectangular having parallel sides 4,6, and parallel ends 8, 10. A multiplicity of LED's 12 are contained in the assembly and are located in accordance with a grid pattern so that the LED's are arranged in columns 14 which extend between the ends 8, 10, and parallel spaced apart rows 16 which extend between the sides 4, 6. The individual LED's are selectively energized by access conductors 18, 22 on projecting portions 20, 24 of a substrate film which is described below. The assembly 2 comprising the film 26 having the LED's 12 mounted therein and a grating 52 against which the film is mounted so that the individual LED's have portions thereof disposed in the cells 58 of the grating.

The film 26 is preferably of a somewhat flexible insulating material such as polyimide (Kapton), having a thickness of about 0.002 inches. Film 26 has a first surface 28 which is directed downwardly in FIG. 3 and an upwardly directed second surface 30 and has first and second bus conductors 32, 34 on the surfaces 28, 30 respectively. These conductors can be provided on the surfaces of the film by conventional known processes such as a selective etching of a film-metal laminate. The conductors 32, 34 are preferably of copper and have a thickness of about 0.0005 inches. The conductors may be produced on the film by sensitising the surfaces of the film to the reception of copper deposited by an electroless process, depositing an extremely thin coating of electroless copper over the surfaces, and then building up the thickness of the copper by electrolytic deposition. Photolithographic and etching processes are employed to produce the conductor traces required and remove the unwanted copper. For improved contact with the LED's a final thin coating of gold or tin may be applied to the conductors.

The individual LED-receiving sites 36 in the film 26 each comprise a pair of spaced-apart openings 40 in the film and a slit 38 extending between the openings. The openings and the slit thus define tongues or flaps 39, 41 which extend towards each other and which can be flexed upwardly as viewed in FIGS. 3 and 4 when a LED is inserted into a LED site as will be described below.

The first bus conductors 32 on surface 28 of film 26 merge with the access conductors 18 on the extension 20 of the film and these first bus conductors extend between the ends 8, 10 of the assembly with one bus conductor 32 located between adjacent columns of the LED sites 36. The second bus conductors 34 on the second surface 30 of the film merge with the access conductors 22 and extend between the sides 4 and 6 of the assembly 2 with one conductor 34 located between adjacent rows of LED receiving sites 36. It will thus be apparent that each LED receiving site 36 has associated therewith a crossing point of one of the first bus conductors and one of the second bus conductors. The individual LED's are electrically connected to the first and second bus conductors of the associated crossing point in a manner which will now be described.

Figure 3:
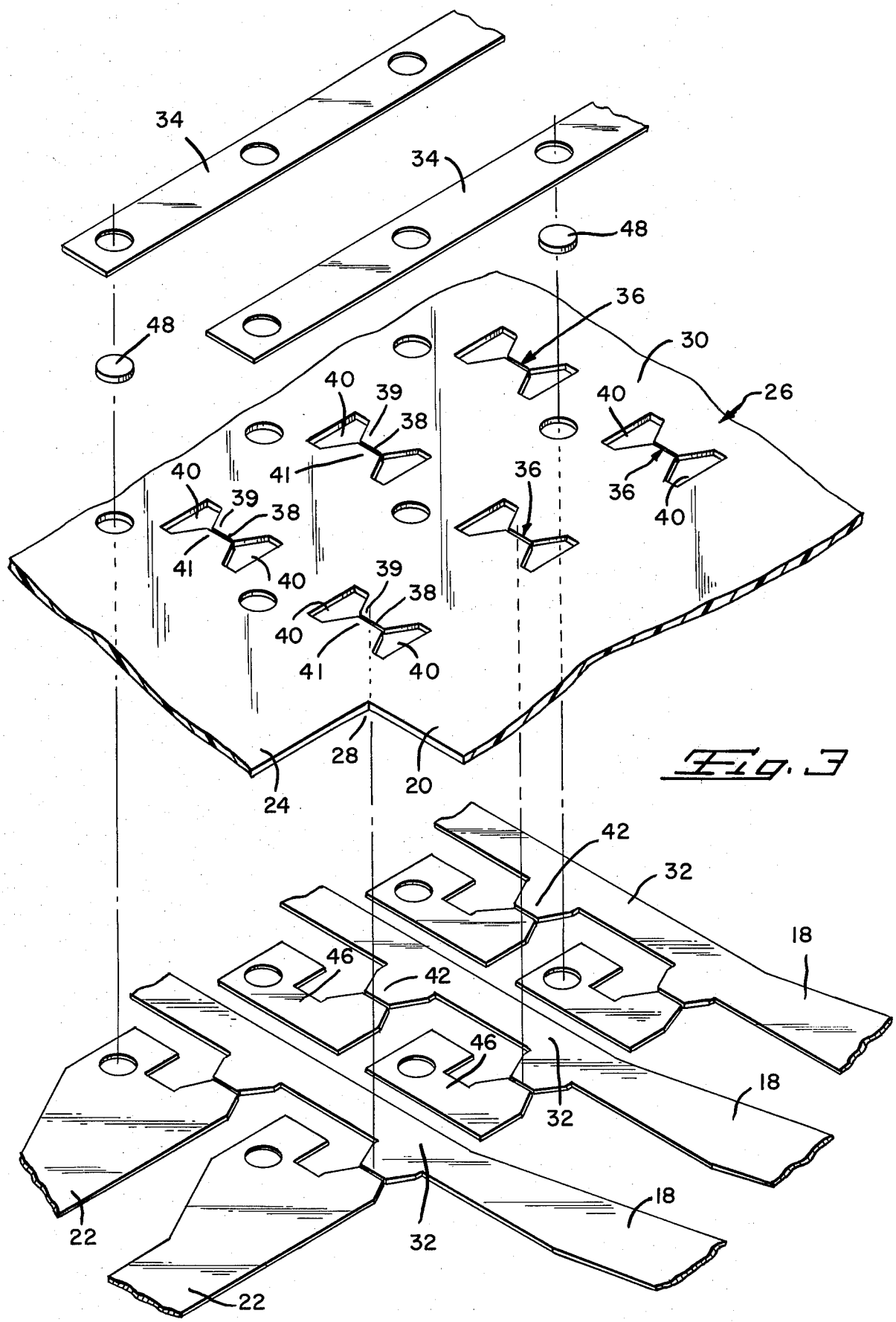
FIG. 3 is a fragmentary perspective view of a portion of the flexible circuit with the conductors exploded from the surfaces of the film.
Figure 7:
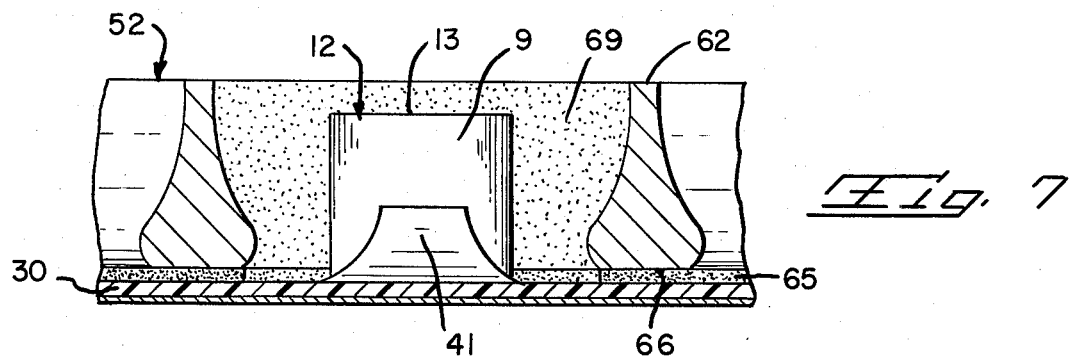
FIG. 7 is a view taken along the line 7—7 of FIG. 6.
Figure 8:
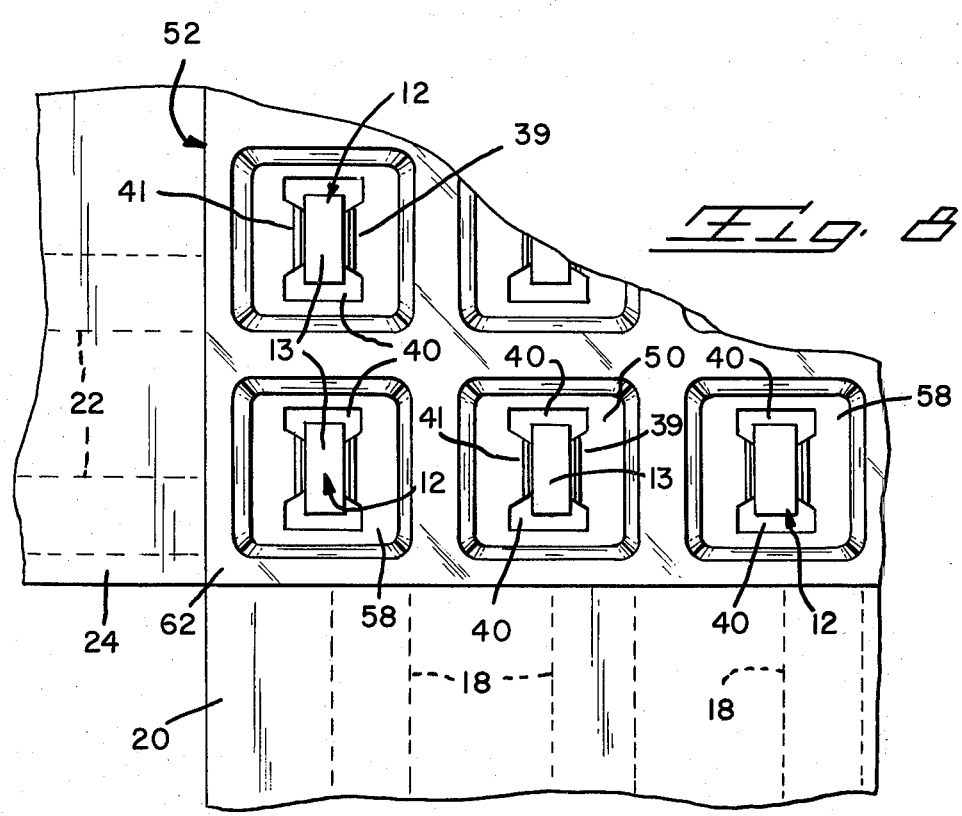
FIG. 8 is a fragmentary top plan view of a portion of the assembly looking towards the exposed surface of the grating.

As shown in FIG. 3 each of the first bus conductors 32 has a plurality of integral tap conductors 42 extending laterally therefrom towards the individual LED receiving sites 36. These tap conductors conform generally in shape to the tongues 39 and extend to the slit 38 of the site. The second bus conductors 34 are provided with second tap conductors 46 on the downwardly facing first surface 28 of the film and which extend across the tongues 41 at the sites 36. The second tap conductors 46 extend through the film 26 to the second bus conductors 34 as shown by the exploded sections 48, FIG. 3, of via conductors. As also shown in FIG. 3, the access conductors 22 are on the downwardly facing surface of the film and these access conductors 22 are connected to the second bus conductors 34 by via conductors 48 adjacent to the side 6 of the assembly. In other words, the tap conductors 46 on the left in FIG. 3 and the access conductors 22 are connected to the second bus conductors by single via conductors 48. The portions of the tap conductors 42 and 46 which are immediately adjacent to the slits 38 serve as contact areas 44, 50 (FIG. 6) in that they are disposed against, and in electrical contact with the LED's.

The LED's are electrically connected to the tap conductors at the individual LED sites by locating the LED's as diagrammatically shown in FIG. 5 adjacent to the surface 28 and with the LED's oriented such that the anode and cathode sides 9, 11 disposed in planes parallel to the slit 38 of the LED site. The LED is then moved relatively towards and past the surface 28 of the film and into the LED site with accompanying flexure of the tongues 39, 41 upwardly as viewed in FIGS. 4 and 5 so that the contact areas 44, 50 of the tap conductors are against the anode and cathode surfaces of the LED. Stable and reliable electrical contact is maintained by the contact surfaces and the LED's by virtue of the fact that each LED is force-fitted into its LED receiving site and the contact surfaces are maintained against the LED's by the flexed tongues 39, 41 of the film which resiliently press the contact areas 44, 50 against the surfaces 9, 11 of the LED.

The grating 52, in the finished display assembly, is disposed against the second surface 30 of the film 26 and has its lower surface 66 bonded by an adhesive 65 to the film. This grating comprises first grating bars 54 which extend parallel to, and are in alignment with, the first conductors 32. Second grating bars 56 extend parallel to, and are in alignment with, the second bus conductors 34. The grating bars 54, 56 thus define a multiplicity of individual cells 58 which extend through the grating from the surface 62 to the downwardly facing surface 66 and which surround the individual LED's 12.

Grating 52 may be of any fairly rigid material and should be non-conducting on its lower surface. A firm plastic material can be used or the grating may be of metal and the individual cells produced by selective etching of the surfaces 62, 66. When the grating is of metal, the surface 66 can be coated with epoxy which serves the dual function of insulating this surface and bonding the grating to the surface 30 of the film 26. As shown by the cross-sectional views, the individual cells are generally square at the upper surface 62 but fair to a somewhat parabolic internal surface which extends to a constricted neck portion which is proximate to the lower surface 66. The lower portions of the cells have a cross-sectional area which is somewhat less than the upper portions and the openings in the lower surface 66 are somewhat smaller than the openings 60, on the upper surface 62. The internal sidewalls of the cells can be given this shape by control of the etching process in which the cells are produced. The grating is exposed to the etchant on its upper surface 62 for a greater time than for its lower surface 66, so that the etchant will remove more material from the upper surface and produce the hour-glass shape shown. The size of the openings 64 on the lower surface can also be controlled by masking during the manufacturer of the grating.

The manufacture of a display assembly 2 will be apparent from the drawing figures. After the flexible circuit 26 has been prepared by forming the openings 40 and slits 38 at the LED receiving sites and forming the conductors 32, 34 on the surface 28, 30, the grating 52 is bonded by adhesive 65 to the surface 30 with a site 36 in alignment with each of the cells 58 in the grating. The grating serves to support the film and mechanically to isolate each of the LED receiving sites from its neighbors for reasons which will become apparent.

The LED's are then oriented so that their anode and cathode sides are as shown in FIG. 4 and they are inserted past the surface 28 of the film into the LED receiving sites. During insertion, the tongues 39, 41 of the film and the contact portions 44, 50 of the tap conductors will be flexed upwardly as viewed in FIG. 6. After completion of the insertion operation, the contact portions will thus be in contact with the LED's and the upper portion of each LED will be contained in the upper portion of the cell. The generally parabolic surfaces of the cells thus serve to reflect light from the LED and direct it past the surface 62 of the grating towards the viewer. The physical isolation of the individual LED's in the cells results in a focusing effect which in turn results in improved sharpness and enhances the brilliance of the display.

The grating, in effect, functions as a fixture during an assembly of LED's to the film in that the flexible, relatively fragile film is accurately positioned against the surface of the dimensionally accurate and precise grating so that the sites 36 are precisely located. The LED's can be assembled to the film and grating by a suitable "pick and place" apparatus having means for orienting and inserting LED's into the film. In the finished assembly, the grating also serves the mechanical function of supporting the film and protecting the LED's.

While the sub-assembly comprising the grating 52, the flexible film 26, and the LED's is relatively strong and robust, it is often desirable to pot the individual LED's with a potting compound such as epoxy as shown at 69 in FIG. 6. The potting material further strengthens the assembly and prevents loss of LED's during abusive handling. An added advantage of the use of the potting material is that the transfer of heat from the LED's is facilitated in that more heat will be removed per unit of time through the potting material than can be removed through air.

It has been found that a display device in accordance with the invention can be conveniently produced on a 0.030 grid using LED's having the dimensions noted above, that is having a thickness of 0.006 inches along their edges. This 0.030 grid will produce a display having 33 lines per inch, a standard which produces good resolution.

The grating 52 advantageously has a thickness which is substantially equal to the length of the individual LED's along their edges, that is 0.012 inches. When the LED's and the flexible circuit are assembled to the grating as shown in FIG. 6, the surfaces 13 of the LED's will be close to, but recessed from, the surface 62 by a distance of about 0.002 inches to 0.004 inches. This feature is advantageous in that, while the chip is completely surrounded and protected by the grating, the surface of the chip is nonetheless immediately adjacent to the surface of the grating.

Figure 1:
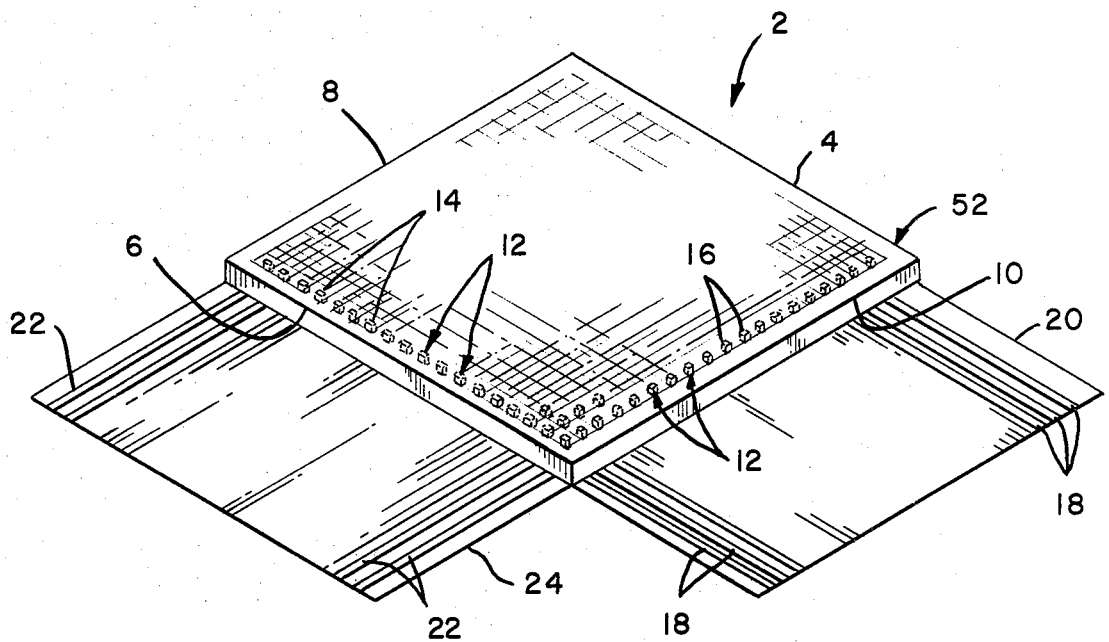
FIG. 1 is a semi-diagrammatic perspective view of a display assembly in accordance with the invention.
Figure 2:
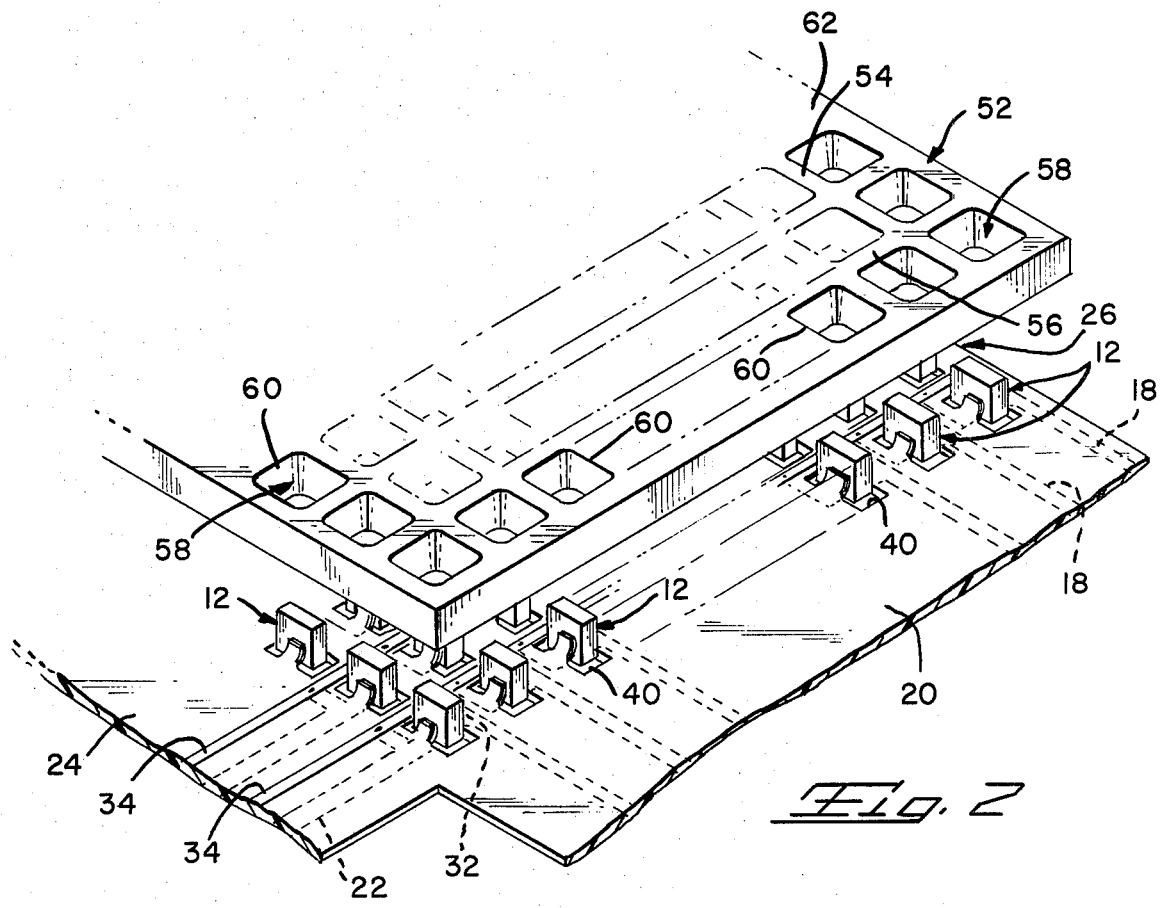
FIG. 2 is a fragmentary perspective view on an enlarged scale showing the grating exploded from the flexible circuit in which the LED's are contained.
Figure 11:
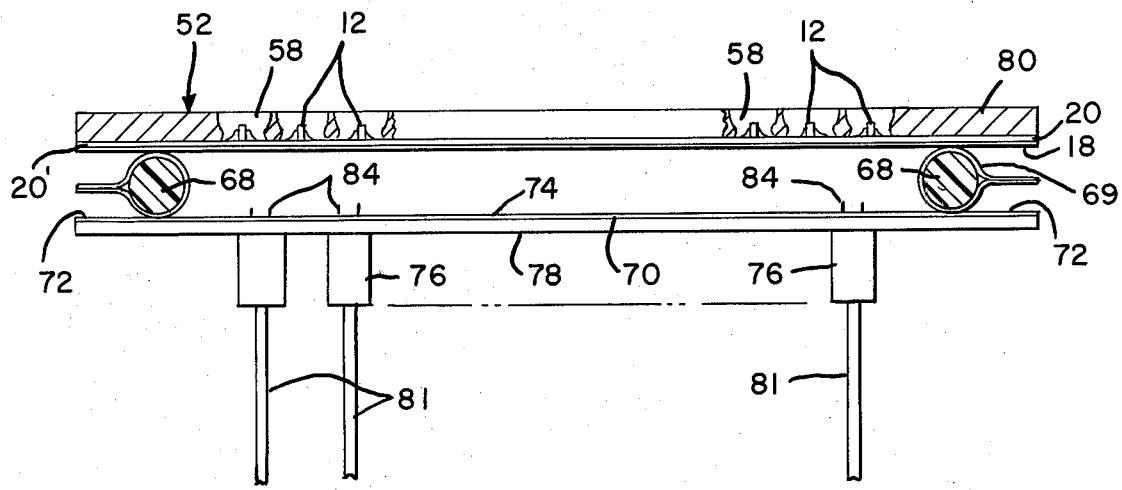
FIG. 11 is a view of a display assembly and a circuit board having conductors on its surface which are connected to the access conductors of the display assembly.
Figure 12:
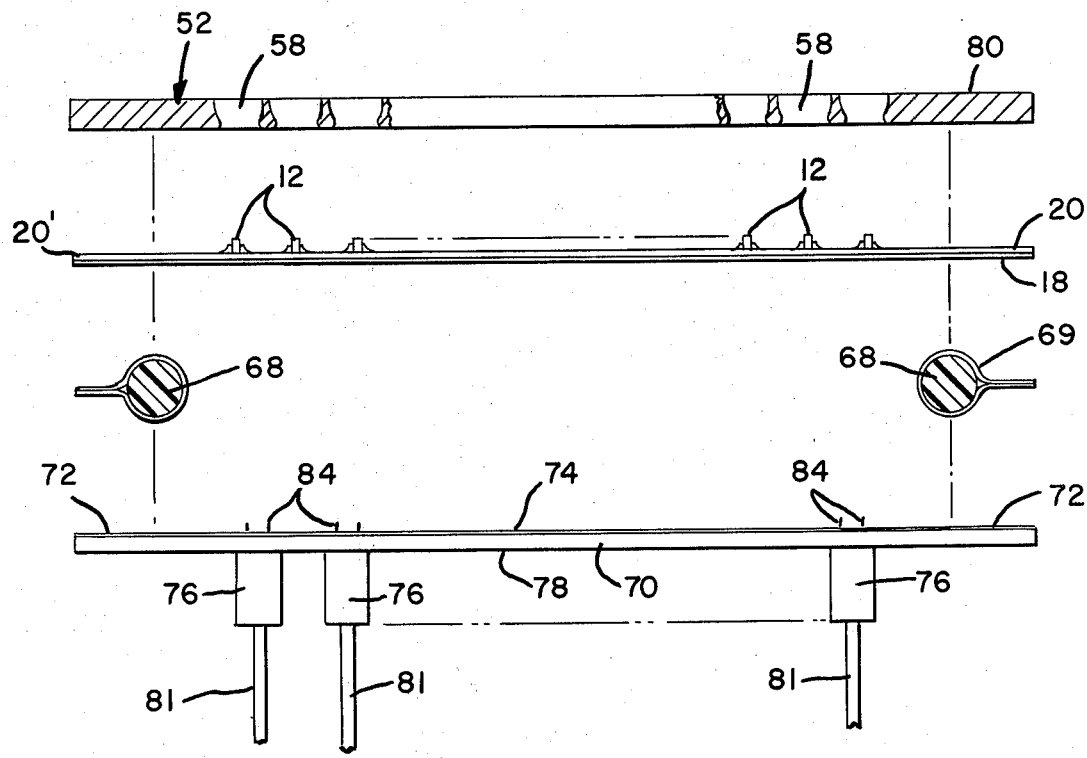
FIG. 12 is a view similar to FIG. 11 but showing the parts exploded from each other.

The sub-assembly described above can be connected to drive circuits and a power supply by any suitable packaging arrangement. FIGS. 11 and 12 show a packaging arrangement in which the access conductors 18, 22 are connected to conductors 72 on the upper surface 74 of a printed circuit board 70 by compressible elastomeric connectors 68 which may be of the type described in U.S. Pat. No. 3,985,413 and which comprises a cylindrical section of elastomeric material having a film 69 extending around its surface. Spaced apart narrow conductive bands are provided on this film 69 and serve as conducting paths between the access conductors and the conductors 72 on circuit board 70. In the embodiment shown in FIG. 11, the access conductors extend in both directions from the display as shown at 20 and 20'; in other words, the extensions of the film as shown at 20 and 22 in FIG. 1 are provided at both ends and both sides of the array. This arrangement is advantageous in that redundant circuit patterns are provided for the bus conductors and if the amperage is relatively high, power can be supplied from two directions into the array. It will also be noted that the surrounding frame 80 of the grating is somewhat enlarged in FIG. 11 so that it extends over the portions 20, 20' of the film.

In the embodiment shown in FIGS. 11 and 12, the conductors on the upper surface 74 of circuit board 70 extend to terminals 84 to which they are soldered. Terminals 84 in turn extend through circuit board 70 and are contained in connectors 76 on the downwardly facing surface 78 of circuit board 70. The connectors 76 are mated with additional circuit boards 81 upon which the driver circuits are mounted. It will be apparent that other arrangements might be employed to transmit the driving signals to the array; for example, the driver circuits can be remote from the array and the signals transmitted by cables extending to the connections 76.

We claim:

1. A flat panel display device of the type comprising a multiplicity of LED's and first and second bus conductors, said LED's being arranged in parallel side-by-side rows and parallel side-by-side columns, said columns extending normally of said rows, said columns and said rows defining a grid pattern, said first bus conductors extending parallel to said rows with one first bus conductor adjacent to each row, said second bus conductors extending parallel to said columns with one second bus conductor adjacent to each of said columns, each of said LED's being electrically connected to one of said first bus conductors and to one of said second bus conductors at a crossing point of said bus conductors, said display device being characterized in that:

said first and second bus conductors are on the oppositely facing first and second surfaces of a flexible insulating film, said film having openings therein which are located on said grid pattern, said openings being between adjacent first bus conductors and between adjacent second bus conductors, each of said LED's being inserted into one of said openings, each of said LED's being connected to one of said first bus conductors and one of said second bus conductors by first and second tap conductors, each of said first and second tap conductors extending laterally from said one first and said one second bus conductor respectively at a location adjacent to said crossing point of said one first and said one second bus conductor, each of said second tap conductors having a via conductor extending through said film from said second surface to said first surface, each of said tap conductors having a terminal portion on said first surface, said terminal portions being immediately adjacent to said openings.

2. A display device as set forth in claim 1, said LED's being inserted into said openings from said first surface and extending past said second surface, portions of said film adjacent to said openings being flexed laterally and extending past said second surface, said terminal portions of said tap conductors being against, and in electrical contact with, said LED's.

3. A display device as set forth in claim 2 having a non-conducting grating associated therewith, said grating being against said second surface and having grating bars which extend parallel to, and are in alignment with, said first and second bus conductors, said grating having columns and rows of open cells conforming to said grid system, said LED's having portions thereof in said cells.

4. A flat panel display device of the type comprising a multiplicity of LED's and first and second bus conductors, said LED's being arranged in parallel side-by-side rows and parallel side-by-side columns, said columns extending normally of said rows, said columns and said rows defining a grid pattern, said first bus conductors extending parallel to said rows with one first bus conductor adjacent to each row, said second bus conductors extending parallel to said columns with one second bus conductor adjacent to each of said columns, each of said LED's being electrically connected to one of said first bus conductors and to one of said second bus conductors at a crossing point of said bus conductors, said display device being characterized in that:
said first and second bus conductors are on the oppositely facing first and second surfaces of a flexible insulating film, said film having openings therein which are located on said grid pattern, said openings being between adjacent first bus conductors and between adjacent second bus conductors, said LED's being inserted into said openings,
a non-conducting rigid grating disposed against said second surface, said grating having grating bars which extend parallel to, and are in alignment with, said first and second bus conductors, said grating having rows and columns of open cells conforming to said grid system, said LED's extending into said open cells,
said grating being in supporting relationship to, and being bonded to, said film.

5. A display device as set forth in claim 4, said grating being bonded to said second surface of said film.

6. A display device as set forth in claim 5, each of said cells having internal sidewalls, said sidewalls surrounding, and serving as reflecting surfaces for, said LED's.

7. A display device as set forth in claim 6, said internal sidewalls forming a substantially parabolic reflecting surface.

8. A flat panel display device as set forth in claim 4, each of said LED's being connected to one of said first bus conductors and one of said second bus conductors by first and second tap conductors, each of said first and second tap conductors extending laterally from said one first and said one second bus conductor respectively at a location adjacent to said crossing point of said one first and said one second bus conductor.

9. A flat panel display device as set forth in claim 8, each of said second tap conductors having a via conductor extending through said film from said second surface to said first surface, each of said tap conductors having a terminal portion on said first surface, said terminal portions being immediately adjacent to said openings.

10. A display device as set forth in claim 9, said LED's being inserted into said openings from said first surface and extending past said second surface, portions of said film adjacent to said openings being flexed laterally and extending past said second surface, said terminal portions of said tap conductors being against, and in electrical contact with, said LED's.

11. A flexible circuit which is intended to receive, and establish electrical contact with, a multiplicity of solid state devices such as LED's, said flexible circuit comprising:
a flexible insulating film having oppositely facing first and second surfaces, a multiplicity of device-receiving openings in said film, said openings being arranged in columns and rows, said rows extending normally of said columns, said openings defining a grid system,
a multiplicity of first and second bus conductors on said first and second surfaces respectively, said first bus conductors extending parallel to said rows with one first bus conductor between adjacent rows of openings, said second bus conductors extending parallel to said columns with one second bus conductor between adjacent columns,
first and second tap conductors associated with each of said openings, each first tap conductor extending from an adjacent first bus conductor towards the associated one of said openings, each second tap conductor extending from an adjacent second bus conductor through said film to said first surface and towards said associated one of said openings, each of said first and second tap conductors having terminal portions which are immediately proximate to the said associated one of said openings,
each of said openings being dimensioned to receive one of said devices with accompanying flexure of portions of said film in the direction of insertion of the device whereby,
upon insertion of said devices into said openings from said first surface until said devices extend partially through said openings, portions of said film having said terminal portions of said tap conductors thereon will be flexed in the direction of insertion and said terminal portions will be against, and in electrical contact with, said devices.

* * * * *